United States Patent [19]
Klingbiel

[11] Patent Number: 5,592,093
[45] Date of Patent: Jan. 7, 1997

[54] ELECTRONIC BATTERY TESTING DEVICE LOOSE TERMINAL CONNECTION DETECTION VIA A COMPARISON CIRCUIT

[75] Inventor: August G. Klingbiel, Willowbrook, Ill.

[73] Assignee: Midtronics, Inc., Burr Ridge, Ill.

[21] Appl. No.: 436,017

[22] Filed: May 5, 1995

[51] Int. Cl.⁶ .......................... G01N 27/27; G08B 29/04
[52] U.S. Cl. ................................... 324/426; 340/636
[58] Field of Search .......................... 324/425, 426, 324/427, 428, 429, 430, 433, 434, 435, 436, 437, 525, 526, 600, 672, 673, 679, 680, 691, 725, 538; 340/636

[56] References Cited

U.S. PATENT DOCUMENTS

| | | | |
|---|---|---|---|
| 3,607,673 | 9/1971 | Seyl | 324/426 |
| 3,873,911 | 3/1975 | Champlin | 324/29.5 |
| 3,889,248 | 6/1975 | Ritter | 324/538 |
| 3,909,708 | 9/1975 | Champlin | 324/29.5 |
| 4,816,768 | 3/1989 | Champlin | 324/428 |
| 4,825,170 | 4/1989 | Champlin | 324/436 |
| 4,881,038 | 11/1989 | Champlin | 324/426 |
| 4,912,416 | 3/1990 | Champlin | 324/430 |
| 5,140,269 | 8/1992 | Champlin | 324/433 |
| 5,519,383 | 5/1996 | De La Rosa | 324/435 |

*Primary Examiner*—Sandra L. O'Shea
*Assistant Examiner*—Roger Phillips
*Attorney, Agent, or Firm*—Westman, Champlin & Kelly, P.A.

[57] ABSTRACT

An electronic battery testing device includes first and second electrical probes for coupling to first and second battery terminals, respectively, and electrical circuitry coupled to the electrical probes for providing an output related to battery condition. The probes each have a pair of electrical connections. A bridge circuit connected between the first and second electrical probes provides a bridge output. An amplifier connected to the bridge output provides an amplified output. The amplified output is indicative of a loose connection between an electrical probe and a battery terminal. The amplified output may be used to indicate an alarm condition.

11 Claims, 4 Drawing Sheets

5,592,093

ELECTRONIC BATTERY TESTING DEVICE LOOSE TERMINAL CONNECTION DETECTION VIA A COMPARISON CIRCUIT

BACKGROUND OF THE INVENTION

The present invention relates to electronic battery testing devices. More particularly, the invention relates to electronic battery testing devices which have electrical probes which connect to terminals of a battery.

Electronic battery testing devices are known. For example, U.S. Pat. No. 3,873,911, issued Mar. 25, 1975, to Champlin, entitled "ELECTRONIC BATTERY TESTING DEVICE," discloses an electronic battery testing device which provides an output of dynamic power.

Electronic battery testing devices require electrical connections to terminals of the battery under test. A poor or faulty (i.e., high-resistance) connection can result in an incorrect reading. Typically, the electrical probes were "wiggled" by the operator as the output of the battery testing device was monitored to determine if there was a good electrical connection between the battery terminal and the probe. A poor connection was indicated by instability in the output of the battery testing device. However, failure by the operator to recognize a high-resistance connection could result in an improper assessment of the battery. Such an improper assessment could be costly. For example, if a "bad" battery were tested "good," extra time could be spent trying to locate the source of a problem or the battery could fail at a critical time. Alternatively, if a "good" battery tested "bad," it could result in replacement of a battery operating within nominal parameters.

Thus, the prior art lacks an easy to use technique for indicating a "poor" or high-resistance connection between a probe of a battery testing device and a terminal of a battery.

SUMMARY OF THE INVENTION

A battery testing device includes a first electrical probe for coupling to a first battery terminal and a second electrical probe for coupling to a second battery terminal. Each probe provides at least two connections to a battery terminal. Electrical circuitry connects to the first and second probes and provides an output related to battery condition. A bridge circuit is connected between the connections of the first and second probes and provides a bridge output. An amplifier amplifies the bridge output and provides an amplified output. The amplified output is related to a high-resistance connection between an electrical probe and a battery terminal. The amplified output may be displayed or coupled to alarm circuitry to indicate a poor connection.

In one embodiment, the bridge comprises op-amps connected between the electrical probes.

DETAILED DESCRIPTION OF THE PREFERRED EMBODIMENTS

Figure 1:
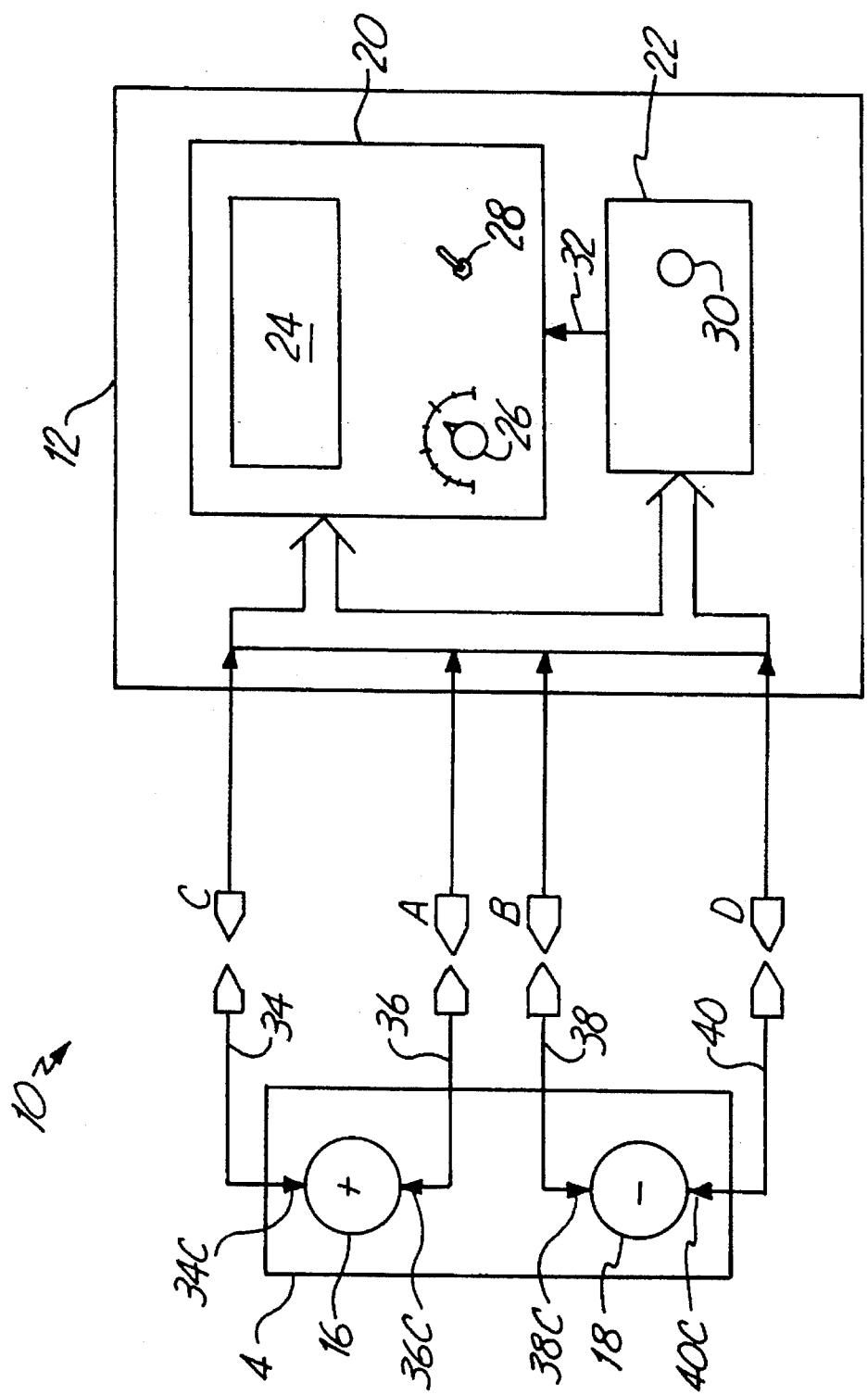
FIG. 1 is a block diagram of a electronic battery testing device with loose terminal connection detection circuit in accordance with the invention.

FIG. 1 is a block diagram showing a battery test system 10 which includes a battery testing device 12 connected to a battery 14. Battery 14 includes positive terminal 16 and negative terminal 18 and may comprise, for example, a lead-acid storage battery. Battery testing device 12 includes electronic battery test circuitry 20 and loose connection detection circuitry 22. The electronic circuitry 20 includes display 24 and inputs 26 and 28. Detection circuitry 22 includes warning lamp 30 and provides an inhibit output 32 to circuitry 20. Battery testing device 12 includes four inputs C, A, B, D for connecting to battery 14 at contacts 34C, 36C, 38C and 40C through connectors 34, 36, 38 and 40, respectively. Such four-point connections are employed to reduce the effects of contact and lead-wire resistance on the measurements and are commonly referred to as Kelvin connections. Connectors A and C are shown connected to positive terminal 16 and connectors B and D are shown connected to negative terminal 18. Electronic circuitry 20 and detection circuitry 22 are connected to connectors A–D.

Electronic circuitry may be an appropriate circuitry for testing a battery. Examples are shown in U.S. Pat. No. 3,873,911, issued Mar. 25, 1975, to Champlin, entitled "ELECTRONIC BATTERY TESTING DEVICE," U.S. Pat. No. 3,909,708, issued Sep. 30, 1975, to Champlin, entitled "ELECTRONIC BATTERY TESTING DEVICE," U.S. Pat. No. 4,816,768, issued Mar. 28, 1989, to Champlin, entitled "ELECTRONIC BATTERY TESTING DEVICE," U.S. Pat. No. 4,825,170, issued Apr. 25, 1989, to Champlin, entitled "ELECTRONIC BATTERY TESTING DEVICE WITH AUTOMATIC VOLTAGE SCALING," U.S. Pat. No. 4,881,038, issued Nov. 14, 1989, to Champlin, entitled "ELECTRONIC BATTERY TESTING DEVICE WITH AUTOMATIC VOLTAGE SCALING TO DETERMINE DYNAMIC CONDUCTANCE," U.S. Pat. No. 4,912,416, issued Mar. 27, 1990, to Champlin, entitled "ELECTRONIC BATTERY TESTING DEVICE WITH STATE-OF-CHARGE COMPENSATION" and U.S. Pat. No. 5,140,269, issued Aug. 18, 1992, to Champlin, entitled "ELECTRONIC TESTER FOR ASSESSING BATTERY/CELL CAPACITY."

In operation, detection circuitry 22 is connected to connectors A–D. As explained below, if one of the connectors A–D is poorly coupled to battery terminal 16 or 18 at conductors 36C, 38C, 34C or 40C, respectively, detection circuitry 22 generates a warning output. This warning output is used to drive lamp 30. Additionally, output 32 from detection circuitry 22 disables operation of circuitry 20. This prevents an operator from obtaining an inaccurate measurement.

Figure 2:
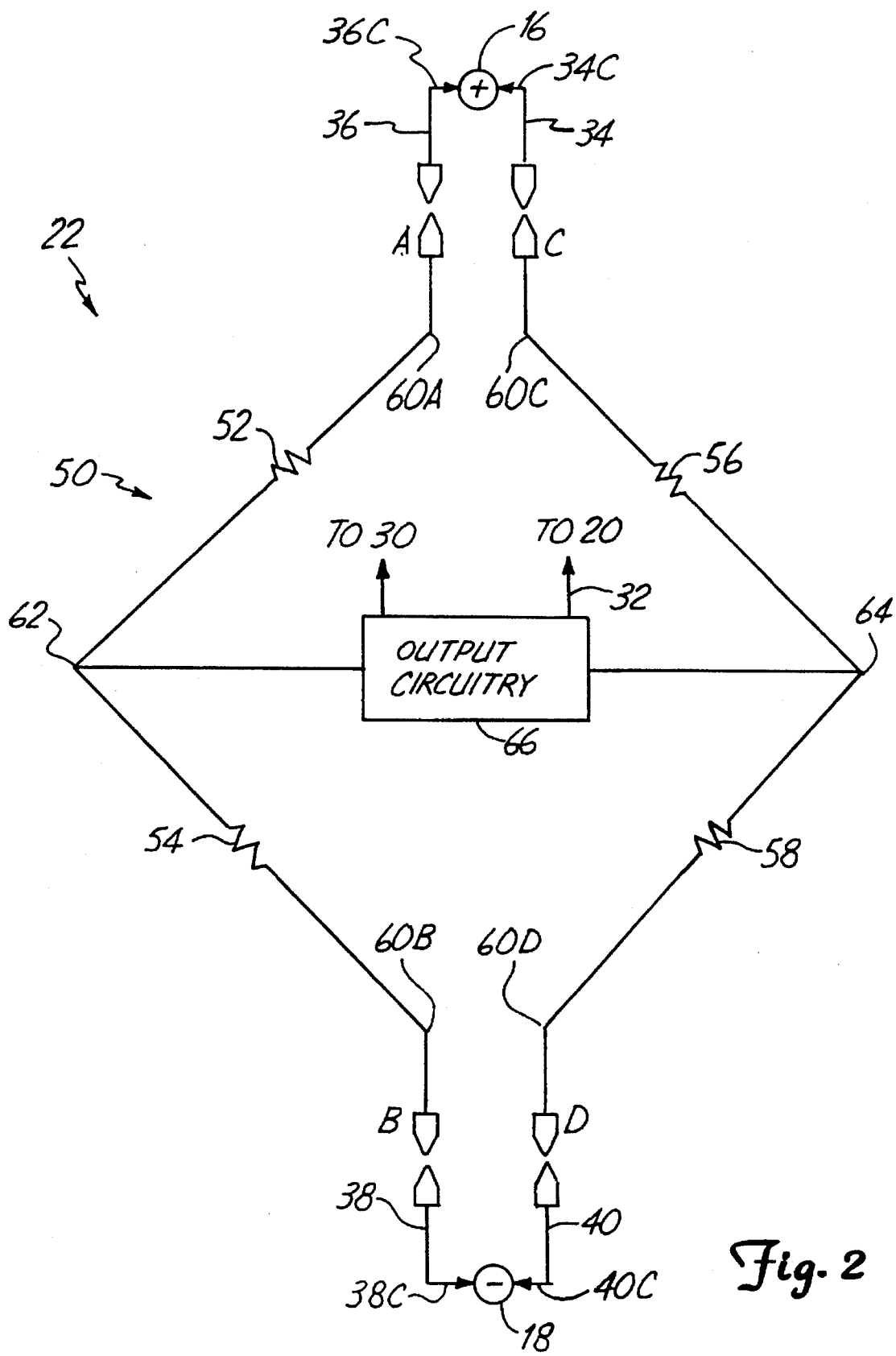
FIG. 2 is a schematic diagram of one embodiment of a loose terminal connection detector circuit.

FIG. 2 is a simplified schematic diagram of detection circuitry 22. Detection circuitry 22 includes a bridge 50 having resistors 52, 54, 56 and 58. The bridge has input connections 60A, 60B, 60C and 60D connected to terminals A, B, C and D, respectively. The bridge output is taken between terminals 62 and 64. Output circuitry 66 is connected between terminals 62 and 64 and provides an output to lamp 30 and an inhibit output 32 to electric circuitry 20.

As shown in FIG. 2, in operation, connections 60A and 60C are connected together at positive terminal 16 of battery 14. Further, connections 60B and 60D are connected together at the negative terminal 18 of battery 14. In one preferred embodiment, resistors 52–58 are all of similar value.

If all connections A–D are properly connected to terminals 16 and 18 at contacts 36C, 38C, 34C and 40C, respectfully, the current through resistors 52 and 54 will be substantially the same as the current through resistors 56 and 58 such that outputs 62 and 64 will be at the same voltage. In this condition, output circuitry 66 provides a high output to lamp 30 such that lamp 30 is not illuminated and provides an output on an inhibit output 32 which allows circuitry 20 to function normally. However, if there is a loose or poor connection (i.e. high resistance) between connections 60A/60C and terminal 16, or between connections 60B/60D and terminal 18, different amounts of current will flow through resistors 52 and 54 than through resistors 56 and 58. This causes a voltage difference to appear between outputs 62 and 64. Output circuitry 66 detects this voltage difference and provides a low output to lamp 30 causing lamp 30 to illuminate indicating a loose connection. Further, inhibit output 32 provides an output to electric circuit 20 to inhibit operation of electric circuitry 20.

Figure 3:
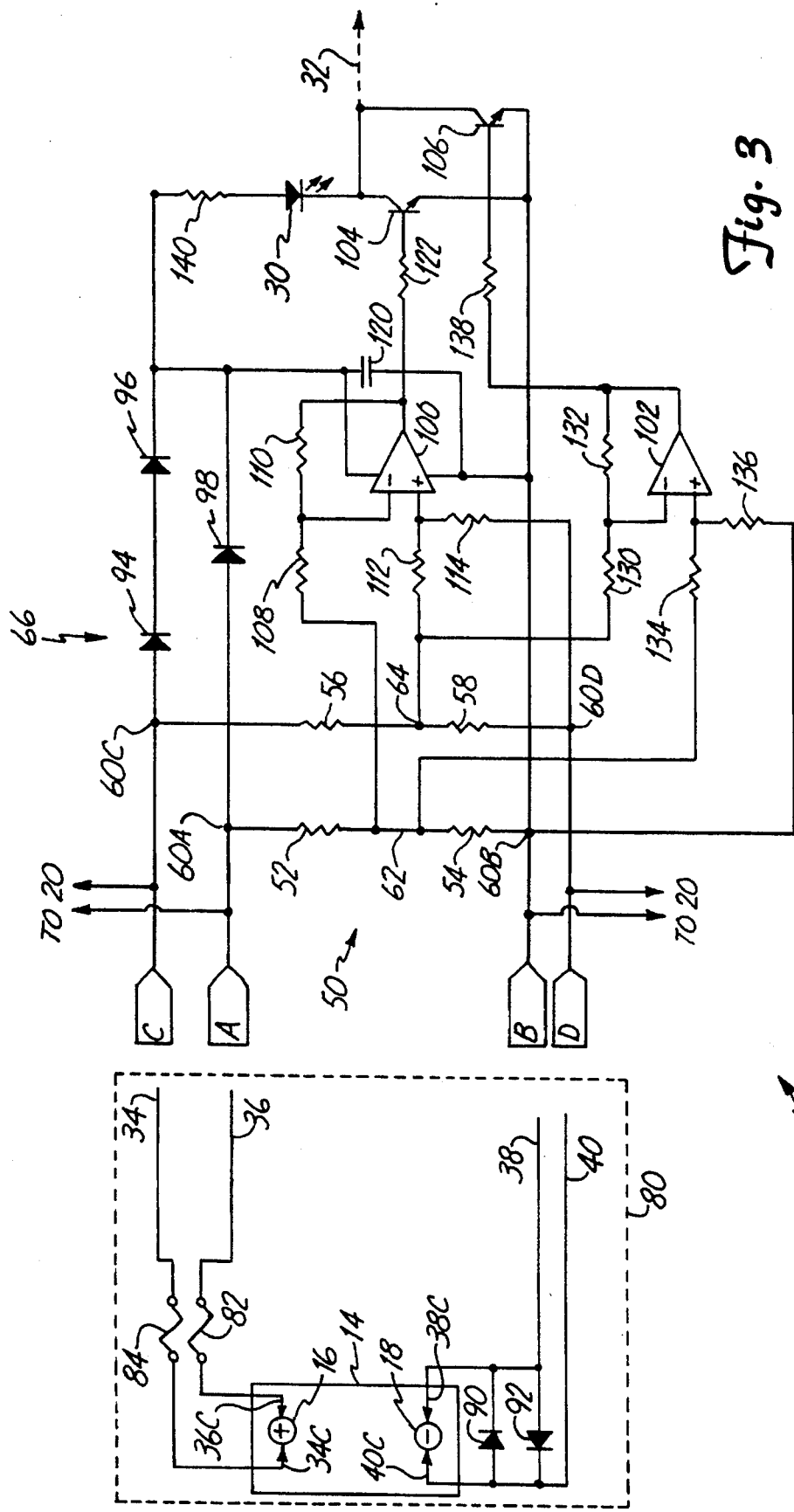
FIG. 3 is a schematic diagram of another embodiment of a loose terminal connection detection circuit.

FIG. 3 is a schematic diagram of one embodiment of the present invention. FIG. 3 shows a typical external circuit 80 to which connectors A–D connect for coupling to battery terminal 16 and 18. Connectors A and C connect to terminal 16 through fuses 82 and 84. Diodes 90 and 92 are connected in opposite directions across connections 38 and 40 so that the circuitry will function even if a contact 38C or 40C is not connected to negative terminal 18. FIG. 3 shows bridge resistors 52, 54, 56 and 58 of bridge 50, shown in FIG. 2. In the embodiment of FIG. 3, resistors 52–58 are all of substantially the same value of about 5.0 KΩ.

Output circuitry 66 includes diodes 94, 96 and 98 to supply operating voltages from terminals A or C to the output circuitry 66. If A-contact 36C makes good contact with positive battery terminal 16, diodes 94 and 96 will have insufficient voltage across them to conduct and output circuitry 66 will be supplied positive operating voltage by contact A through diode 98. However, if A-contact 36C is poor or is removed, diodes 94 and 96 will conduct and output circuitry 66 will still receive positive operating voltage from terminal C via diodes 94 and 96. Output circuitry 66 includes op-amps 100 and 102 which operate as differential amplifiers and output transistors 104 and 106. An inverting input of op-amp 100 is connected to terminal 62 through resistor 108 and has negative feed back through resistor 110. A non-inverting input of op-amp 100 is connected to terminal 64 through resistor 112 and to input 60D through resistor 114. A positive power input of op-amp 100 is connected to connectors A and C via diodes 94, 96 and 98, and a negative input is connected to connector B. Capacitor 120 decouples the power supply voltage. The output of op-amp 100 is connected to the base of transistor 104 through resistor 122. An inverting input of operational amplifier 102 is connected to output 64 through resistor 130. Op-amp 102 has negative feed back through resistor 132. A non-inverting input to op-amp 102 is connected to connection 62 through resistor 134 and to input 60B through resistor 136. The output of op-amp 102 is connected to the base of transistor 106 through resistor 138. The collectors of transistors 104 and 106 are connected to diodes 96 and 98 through light emitting diode 30 and resistor 140.

In one embodiment, component values of the circuitry shown in FIG. 3 are as follows:

| Component | Numeral | Value |
|---|---|---|
| Resistors: | 52 | 5.0 KΩ |
| | 54 | 5.0 KΩ |

-continued

| Component | Numeral | Value |
|---|---|---|
| | 56 | 5.0 KΩ |
| | 58 | 5.0 KΩ |
| | 108 | 97.6 KΩ |
| | 110 | 1.0 MΩ |
| | 112 | 97.6 KΩ |
| | 114 | 1.0 MΩ |
| | 122 | 1.0 KΩ |
| | 130 | 97.6 KΩ |
| | 132 | 1.0 MΩ |
| | 134 | 97.6 KΩ |
| | 136 | 1.0 MΩ |
| | 138 | 1.0 KΩ |
| | 140 | 3.0 KΩ |
| Diodes: | 94 | 1N4002 |
| | 96 | 1N4002 |
| | 98 | 1N4002 |
| | 30 | HLMP4700 |
| Transistors: | 104 | BJT 2N4001 |
| | 106 | BJT 2N4001 |
| Capacitors: | 120 | 0.1 µF |

In operation, op-amp 100 compares the voltage at node 62 with that at node 64, and provides a high output to transistor 104 if either contact 36C makes a high-resistance connection to battery terminal 16 or contact 40C makes a high-resistance connection to battery terminal 18. This causes transistor 104 to conduct, turning on lamp (LED) 30. Similarly, op-amp 102 compares the voltage at node 62 with that at node 64, and provides a high output if either contact 34C makes a high-resistance connection to battery terminal 16 or contact 38C makes a high-resistance connection to battery terminal 18. This high output causes transistor 106 to turn on which turns LED 30 on. Output 32 can be provided to circuitry 20 to inhibit operation of circuitry 20 when any one of the contacts 34C, 36C, 38C or 40C makes a high-resistance connection to the respective battery terminals 16 and 18.

Figure 4:
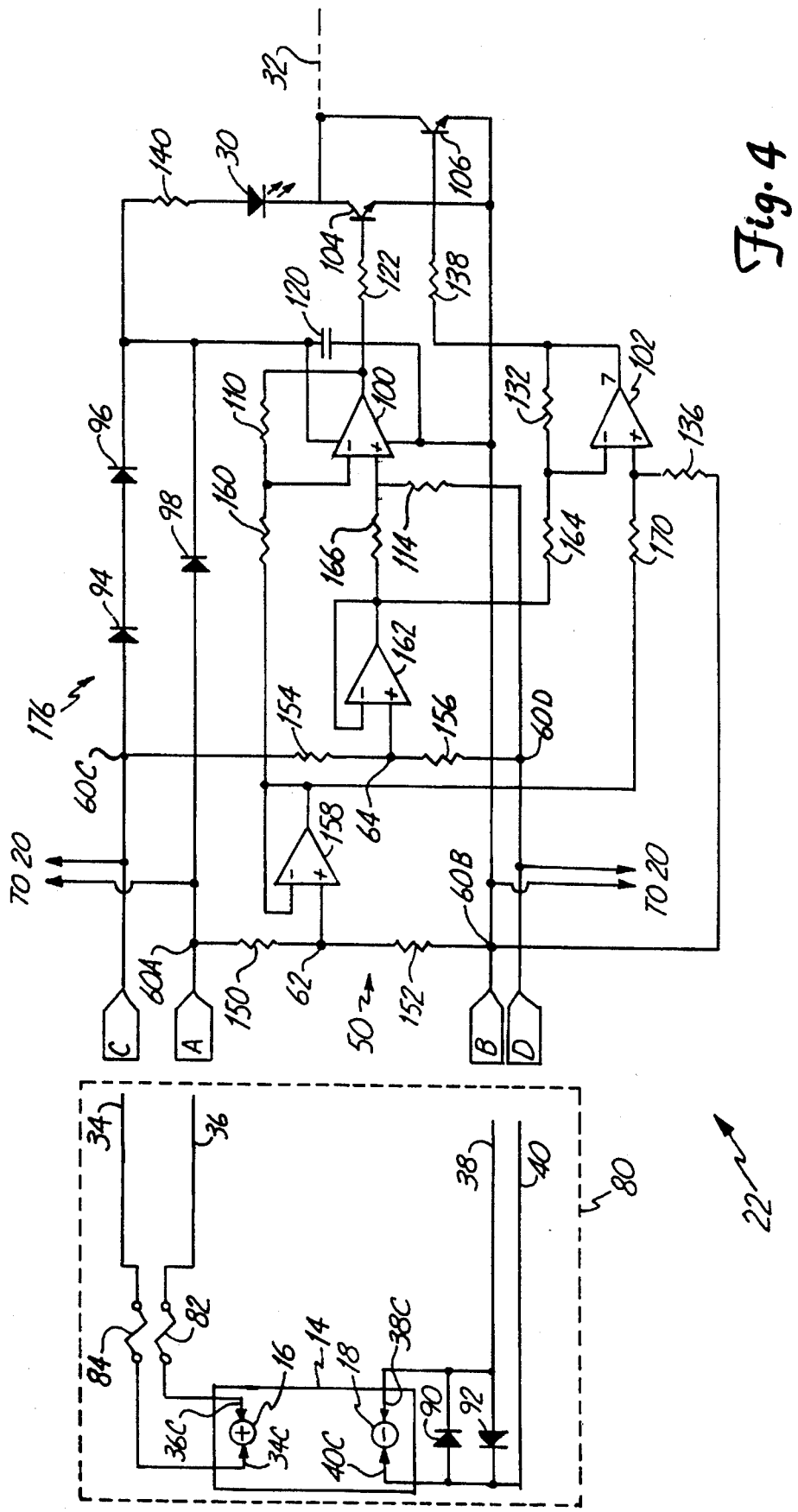
FIG. 4 is a schematic diagram of another embodiment of a loose terminal connection detection circuit.

FIG. 4 shows a circuit similar to FIG. 3 except that it includes unity gain amplifiers and a high impedance bridge which reduces the effect of detection circuitry 22 on battery test circuitry 20. To be consistent, similar parts of similar values have been numbered the same between FIGS. 4 and 3. Bridge 50 includes resistors 150, 152, 154 and 156 connected in a manner similar to that shown in FIG. 2. Unity gain amplifier 158 which comprises an op-amp having negative feed back and has a non-inverting input connected to node 62 and an output connected to the inverting input of op-amp 100 through resistor 160. The output of op-amp 158 is also connected to the non-inverting input of op-amp 102 through resistor 170. Unity gain amplifier 162 is an op-amp having negative feed back with a non-inverting input connected to node 64 and an output connected the inverting input of op-amp 102 through resistor 164 and to the non-inverting input of op-amp 100 through resistor 166.

Operation of output circuitry 176 of FIG. 4 is similar to circuitry 66 of FIG. 3. However, the circuitry of FIG. 4 provides a high impedance across connectors A–D. In operation, unity gain amplifiers 158 and 162 provide buffered inputs to op-amps 100 and 102. The remainder of the circuitry in FIG. 4 operates substantially the same as that described for FIG. 3.

In one embodiment, values of components of FIG. 4 which differ from the values of components in FIG. 3 are as follows:

| Component | Numeral | Value |
|---|---|---|
| Resistors: | 150 | 200 KΩ |
|  | 152 | 200 KΩ |
|  | 154 | 200 KΩ |
|  | 156 | 200 KΩ |
|  | 160 | 100 KΩ |
|  | 164 | 100 KΩ |
|  | 166 | 100 KΩ |
|  | 170 | 100 KΩ |

In general, the present invention detects a poor connection to the battery by detecting an imbalance in a resistance bridge. The imbalance is used to notify the operator and disable measurement circuitry. The present circuitry is capable of operation using power completely supplied by battery 14 so that no external power source is necessary. In designing the circuitry of FIG. 4, the bridge and difference amplifier resistors, op-amp off-sets and circuit gain should be selected such that the output from differential amplifiers 100 and 102 stay below the transistor turn-on voltage across time and temperature changes. For example, in FIG. 4, the circuit gain is 10, the bridge off-set is plus or minus 0.01%, the op-amp off-sets are plus and minus 1 mvolt.

Although the present invention has been described with reference to preferred embodiments, workers skilled in the art will recognize that changes may be made in form and detail without departing from the spirit and scope of the invention. For example, the present invention is intended for use with battery testing devices other than those disclosed herein. Further, different circuit configurations and components are well within the scope of the invention and will be apparent to those skilled in the art.

What is claimed is:

1. A device for accessing condition of a battery, comprising:

a first connector for coupling to a first terminal of the battery;

a second connector for coupling to the first terminal of the battery;

a third connector for coupling to a second terminal of the battery;

a fourth connector for coupling to the second terminal of the battery;

electrical circuitry coupled to the first, second, third and fourth connectors for measuring a parameter of the battery and providing a measurement output;

a bridge circuit having first and second inputs connected to the first and second connectors and third and fourth inputs connected to the third and fourth connectors; and output circuitry connected to a first and a second output of the bridge circuit providing an output in response to a voltage difference detected between the first output and the second output.

2. The device of claim 1 wherein the output circuitry includes unity gain amplifiers connected to the first and second outputs of the bridge circuit.

3. The device of claim 1 wherein the output circuitry includes a comparator for comparing a voltage at the first output with a voltage at the second output of the bridge circuit.

4. The device of claim 1 wherein the output of the output circuitry is connected to the electrical circuitry to inhibit the measurement output in response to a loose connection between a connector and a terminal of the battery.

5. The device of claim 1 including a warning device coupled to the output of the output circuitry to warn of a loose connection between a terminal and a connector.

6. A device for detecting a loose connection in a battery tester having first and second connectors for connecting to a first terminal of a battery and third and fourth connectors for connecting to a second terminal of the battery, the device comprising:

a first circuit connected between the first and third connectors and having an output related to a connection between a connector and a battery terminal;

a second circuit connected between the second and fourth connectors having an output related to a connection between a connector and a battery terminal; and comparison circuitry coupled to the outputs of the first and second circuits which compares the outputs and provides a warning output in response to a detected difference between the outputs.

7. The device of claim 6 wherein the first and second circuits comprises a resistance bridge.

8. The device of claim 6 wherein the comparison circuitry includes an op-amp.

9. The device of claim 6 wherein the warning output is connected to a warning indicator.

10. The device of claim 6 wherein the battery tester measures battery conductance and the first, second, third and fourth connectors provide a Kelvin connection to the first and second battery terminals.

11. The device of claim 6 wherein the warning output is connected to battery test circuitry and inhibits operation of the battery test circuitry upon an occurrence of a high resistance connection.

\* \* \* \* \*